United States Patent [19]
Ogami et al.

[11] Patent Number: 5,888,344
[45] Date of Patent: Mar. 30, 1999

[54] METHOD OF AND AN APPARATUS FOR PROCESSING A SUBSTRATE

[75] Inventors: Nobutoshi Ogami; Hisao Nishizawa, both of Shiga, Japan

[73] Assignee: Dainippon Screen Mfg. Co., Ltd., Japan

[21] Appl. No.: 762,164

[22] Filed: Dec. 9, 1996

[30] Foreign Application Priority Data

Dec. 21, 1995 [JP] Japan .................................... 7-333425

[51] Int. Cl.$^6$ ....................................................... B44C 1/22
[52] U.S. Cl. .......................... 156/642; 156/626; 156/662; 134/108; 137/3; 137/88
[58] Field of Search .................................. 156/642, 662, 156/626; 134/108; 137/3, 88; 216/2

[56] References Cited

U.S. PATENT DOCUMENTS 4,980,017  12/1990  Kaji et al. ................................ 152/642

FOREIGN PATENT DOCUMENTS

| | | |
|---|---|---|
| 59-84839 | 6/1984 | Japan . |
| 2-98631 | 8/1990 | Japan . |
| 3-20895 | 3/1991 | Japan . |
| 6-69179 | 3/1994 | Japan . |

*Primary Examiner*—Jamees C. Housel
*Assistant Examiner*—Jennifer Shaver

*Attorney, Agent, or Firm*—Ostrolenk, Faber, Gerb & Soffen, LLP

[57] ABSTRACT

A substrate processing apparatus does not allow sudden boiling of supplementary liquid but rather sufficiently diffuses the supplementary liquid into processing liquid so that the temperature of the processing liquid does not decrease largely. De-ionized water (PW) is ejected through a plurality of de-ionized water blow-off openings (Ha) which are formed in a de-ionized water injection nozzle (10*a*). Inside an internal bath (1), which is located immediately below the de-ionized water blow-off openings, and close to a overflow part (20*a*) which is a top edge of a side surface (1*a*) of the internal bath (1), the de-ionized water reaches the surface of a phosphoric acid solution (PA). The de-ionized water thereafter reaches a gutter part (30*a*) of an external bath (2), as it is mixed with the phosphoric acid solution (PA), and flows into a reservoir part (30*d*) of the external bath (2). Since the de-ionized water (PW) never reaches inside the phosphoric acid solution (PA) within the internal bath (1), sudden boiling of the de-ionized water (PW) is prevented. The phosphoric acid solution (PA) and the de-ionized water (PW) are stirred up when the phosphoric acid solution (PA) flows over from the internal bath (1) into the external bath (2), and therefore, the de-ionized water (PW) is sufficiently diffused into the phosphoric acid solution (PA). As this does not keep the de-ionized water (PW) at the surface of the phosphoric acid solution (PA), the de-ionized water (PW) does not evaporate directly from the surface of the phosphoric acid solution (PA), a decrease in the temperature of the phosphoric acid solution (PA) is small.

5 Claims, 3 Drawing Sheets

METHOD OF AND AN APPARATUS FOR PROCESSING A SUBSTRATE

BACKGROUND OF THE INVENTION

1. Field of the Invention

The present invention relates to an apparatus which dips a substrate, such as a semiconductor substrate and a liquid crystal glass substrate, into processing liquid to thereby perform surface processing. More particularly, the present invention relates to a substrate processing apparatus which stores processing liquid consisting of a plurality types of liquid in a processing bath, and heats the processing liquid to a temperature which is equal to or higher than a boiling temperature of at least one of the plurality of types of liquids consisting the processing liquid, and dips a substrate into the processing liquid.

2. Description of the Prior Art

During etching of a silicon nitride film which is formed at a surface of a semiconductor substrate using a phosphoric acid solution ($H_3PO_4$) of a high temperature, for example, a change not only in the temperature of the phosphoric acid solution but also in the concentration of the phosphoric acid solution changes an etching rate, thereby resulting in an uneven processing result. Hence, it is necessary to maintain the temperature and the concentration of the phosphoric acid solution within a tolerable range.

However, as it is necessary to keep the phosphoric acid solution at a high temperature around 150°–180° C. during such an etching process, moisture in the solution easily evaporates and accordingly increases the concentration of the phosphoric acid solution, whereby the etching rate is changed and a processing result becomes uneven.

To deal with this, the following four types of methods have been principally used to appropriately add de-ionized water to the phosphoric acid solution during etching.

1. The method described in Japanese Utility Model Laid Open Official Gazette No. 2-98631, which requires to dispose a nozzle having a wall member which is perforated with a number of very fine through holes in a lower portion of a processing bath which is filled with a phosphoric acid solution, so as to supply de-ionized water to the phosphoric acid solution through the nozzle.
2. The method described in Japanese Patent Publication Official Gazette No. 3-20895, which requires to supply de-ionized water to a circulation line which circulates a phosphoric acid solution by leading the phosphoric acid solution which is contained in a processing bath to adjust the temperature of the phosphoric acid, filtering the phosphoric acid solution, and returning the phosphoric acid solution into the processing bath once again.
3. The method described in Japanese Utility Model Laid Open Official Gazette No. 59-84839, which requires to supply de-ionized water through a hole which is formed in a bottom portion of a processing bath.
4. The method described in Japanese Patent Laid Open Official Gazette No. 6-69179, which requires to use a double bath consisting of an internal bath for etching and an external bath which surrounds the same, to always let a phosphoric acid solution flow over into the external bath from the internal bath, and to supply de-ionized water into the phosphoric acid solution stored in the external bath from above the external bath, so that the phosphoric acid solution containing the de-ionized water circulates into the internal bath.

By the way, among the de-ionized water supplying methods described above, the methods 1, 2 and 3 inject de-ionized water into the phosphoric acid solution and hence may cause abrupt boiling of the de-ionized water within the phosphoric acid solution upon injecting of the de-ionized water into the phosphoric acid solution.

Meanwhile, since the method 4 supplies de-ionized water to the surface of the phosphoric acid solution which is stored in the external bath, the de-ionized water stays at the surface of the phosphoric acid solution rather than diffusing into the phosphoric acid solution. Further, as the de-ionized water evaporates from the surface of the phosphoric acid solution, the temperature of the phosphoric acid solution remarkably decreases due to heat of vaporization.

SUMMARY OF THE INVENTION

The present invention is directed to a method of processing a substrate in a processing liquid, comprising the steps of: a) filling an internal bath with processing liquid essentially consisting of a plurality of liquid components, a temperature of the processing liquid being maintained higher than a boiling temperature of at least one of the plurality of liquid components; b) dipping a substrate into the processing liquid in the internal bath; c) letting the processing liquid overflow an edge of the internal bath; d) supplying a supplementary liquid to an overflow of the processing liquid at a top of or around the edge, the supplementary liquid having a boiling temperature lower than the predetermined temperature; e) receiving the overflow of the processing liquid by an external bath surrounding the internal bath; and f) feeding the overflow back to the internal bath, whereby the processing liquid circulates between the internal bath and the external bath while supplied with the supplementary liquid.

As described above, among the plurality of types of liquids consisting of the processing liquid, one having a boiling temperature which is equal to or lower than the processing solution is supplied as the supplementary liquid immediately above or close to an overflow part which allows the processing liquid, which is contained in the internal bath, to flow over. Since this prevents the supplementary liquid from reaching inside the processing liquid, sudden boiling of the supplementary liquid does not occur. Further, since the processing liquid and the supplementary liquid are stirred up when the processing liquid flows over into the external bath from the internal bath, the supplementary liquid sufficiently diffuses into the processing liquid. As this keeps the supplementary liquid at the surface of the processing liquid and prevents the supplementary liquid from evaporating directly into air from the surface of the processing liquid, the temperature of the processing liquid does not decrease largely.

Preferably, a concentration of the processing liquid is monitored to control a rate of the supplementary liquid supplied to the overflow.

Accordingly, an object of the present invention is to provide for a substrate processing apparatus which does not cause sudden boiling of supplementary liquid but ensures sufficient diffusion of the supplementary liquid into processing liquid so that a decrease in the temperature of the processing liquid is small.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
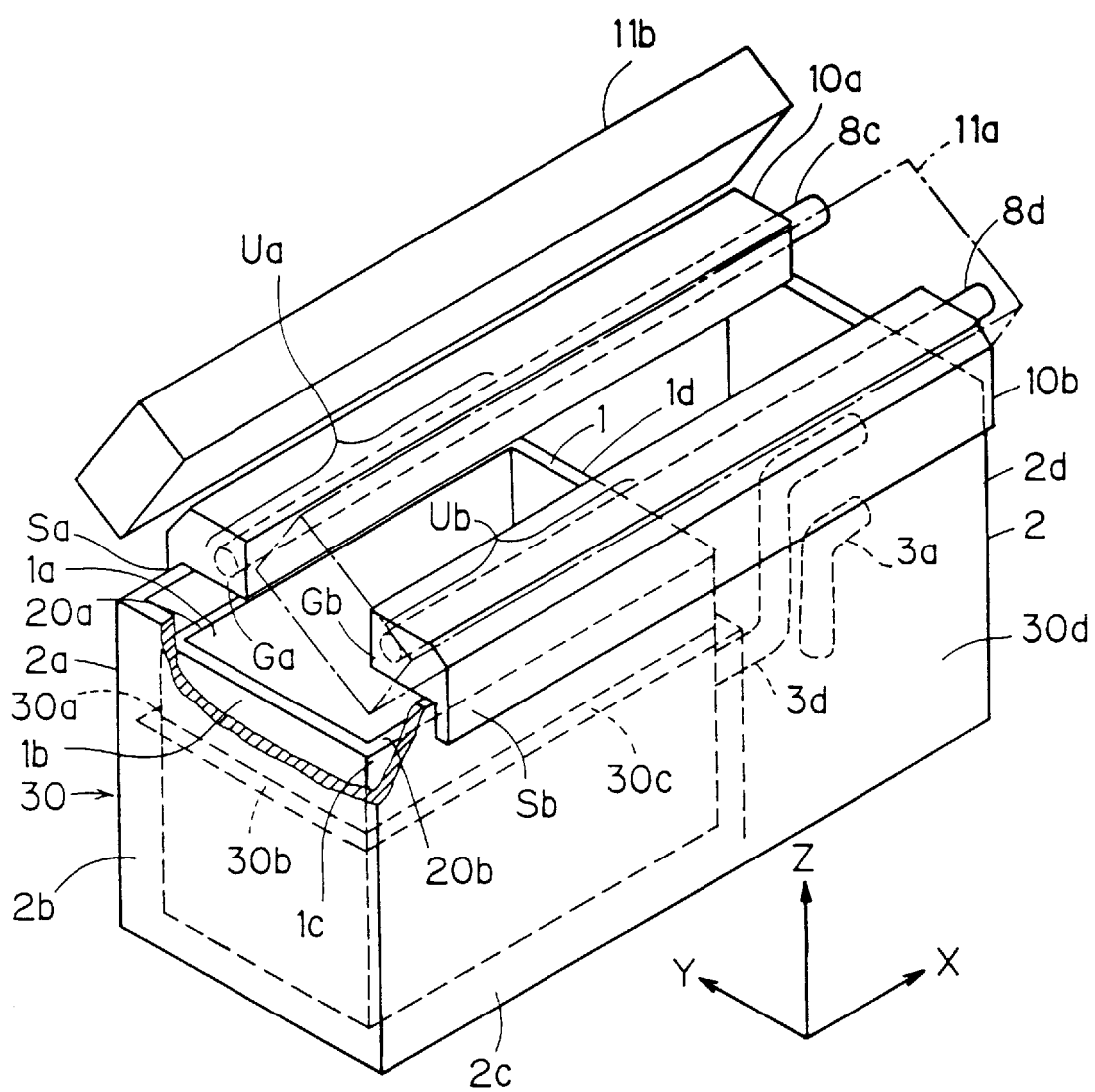
FIG. 1 is a perspective view showing an appearance of a substrate processing apparatus according to a preferred embodiment.
Figure 2:
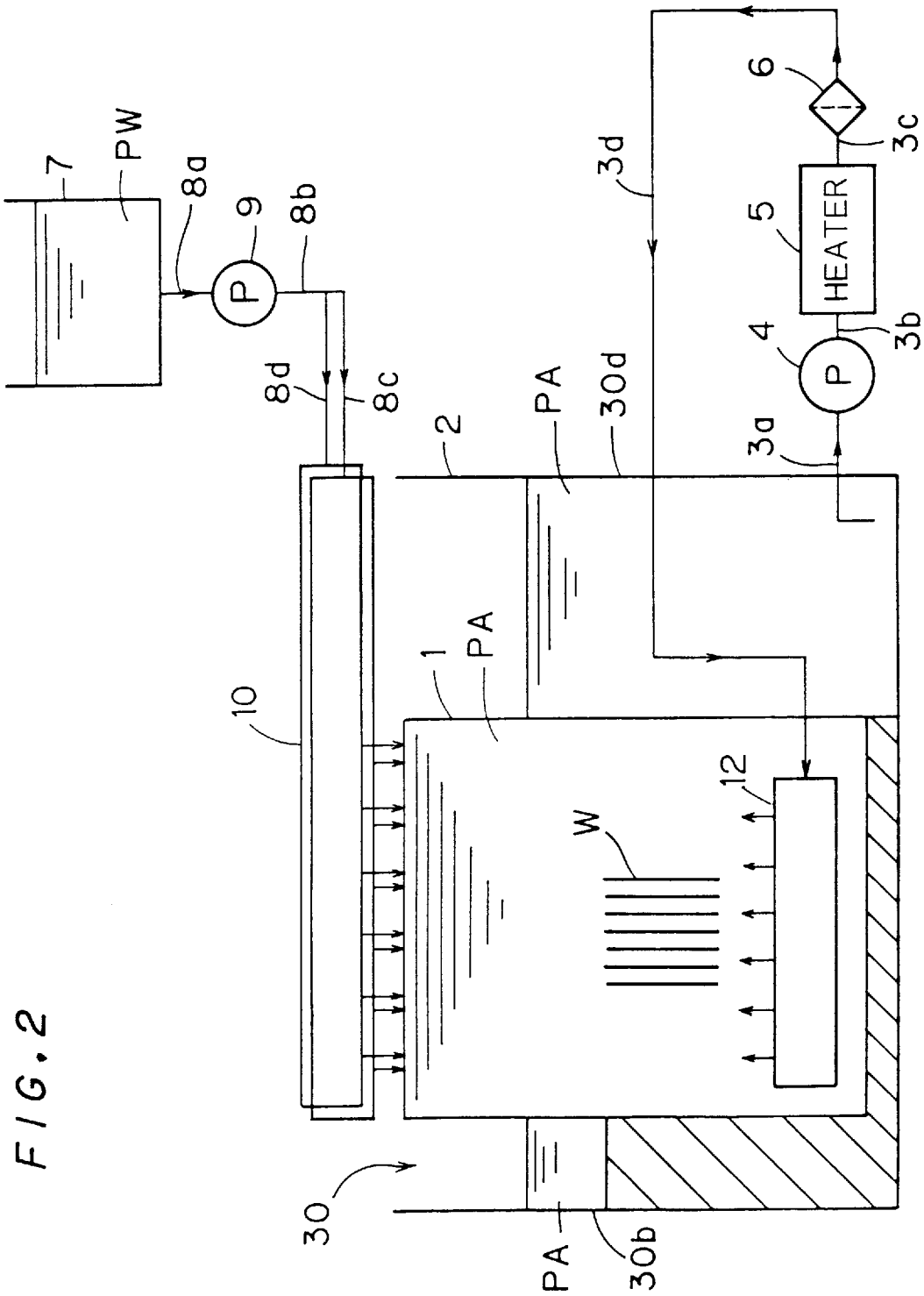
FIG. 2 is a schematic explanatory diagram of the substrate processing apparatus according to the preferred embodiment.

1. Mechanical Structure and Arrangement In Apparatus According To Preferred Embodiment FIG. 1 is a perspective view showing an appearance of a substrate processing apparatus according to a preferred embodiment, and FIG. 2 is a schematic explanatory diagram of the substrate processing apparatus according to the preferred embodiment. In FIG. 1, a three-dimensional coordinate system X-Y-Z is defined with a horizontal plane, which is parallel to a floor plane, regarded as an X-Y plane and a vertical direction regarded as a Z-direction.

Now, a mechanical structure of the substrate processing apparatus according to the preferred embodiment will be described with reference to these drawings.

This substrate processing apparatus is an apparatus for etching a silicon nitride film which is formed on a semiconductor substrate using a phosphoric acid solution of a high temperature. The apparatus comprises a processing bath 30 which consists of an internal bath 1 and an external bath 2. The internal bath 1 is formed by a top-open box-like member. With the internal bath 1 containing the phosphoric acid solution PA of 150°–180° C., substrates W which are transported from other processing part is dipped into the phosphoric acid solution PA which is contained within the internal bath 1 and are then subjected to etching.

The external bath 2, a top-open box-like member, is fixedly disposed externally to the internal bath 1 so as to surround the internal bath 1. The external bath 2 collects the phosphoric acid solution PA which flows over from the top portions of side walls of the internal bath 1.

Further, a pipe 3a is fixed inside the external bath 2 so as to penetrate a side surface 2d of the external bath 2 which is on the positive-value side in an X-direction. Within the external bath 2, one end of the pipe 3a is positioned in the vicinity of a bottom portion of the external bath 2. As shown in FIG. 2 although not shown in FIG. 1, the other end of the pipe 3a is connected to a circulation pump 4, externally to the external bath 2. The circulation pump 4 is connected to a heater 5 through a pipe 3b. The heater 5 is connected to a filter 6 through a pipe 3c. In addition, a pipe 3d which is connected to the filter 6 penetrates a side surface 2d of the external bath 2, at a position above the pipe 3a. Thus, within the external bath 2, the pipe 3d is fixedly disposed to penetrates a side wall of the internal bath 1 which is on the positive-value side in the X-direction, and further, within the internal bath 1, the pipe 3d is connected to a phosphoric acid solution blow-off pipe 12 which is shown in FIG. 2.

On the other hand, one end of a pipe 8a is connected to a de-ionized water bath 7 which is shown FIG. 2, and a fixed quantity pump 9 which pumps up de-ionized water PW under pressure at a predetermined flow rate is connected to the other end of the pipe 8a. Further, one end of a pipe 8b is connected to the fixed displacement pump 9, while the other end of the pipe 8b branches out into two branches which are connected to pipes 8c and 8d, respectively. The pipe 8c is connected to a de-ionized water supply nozzle 10a. The pipe 8d is connected to a de-ionized water supply nozzle 10b.

The de-ionized water supply nozzle 10a is disposed above and close to an overflow portion 20a which is a top edge of a side surface 1a of the internal bath 1 which is on the positive-value side in a Y-direction, while the de-ionized water supply nozzle 10b is disposed above and close to an overflow part 20b which is a top edge of a side surface 1c of the internal bath 1 which is on the negative-value side in the Y-direction.

Further, above the de-ionized water injection nozzles 10a and 10b, to prevent the phosphoric acid solution PA from splashing around during etching, an auto cover 11 (11a, 11b) is disposed which is engaged with a frame not shown. The auto cover 11 is opened only when the substrates W are transported into or out from the same, but are otherwise closed.

Next, detailed structures of principal portions will be described.

As shown in FIG. 1, the side surfaces of each one of the internal bath 1 and the external bath 2 on the four sides are at the same height, and the internal bath 1 is a little lower than the external bath 2. Between the external bath 2 and the internal bath 1, a gutter part 30a having a shallow height is formed between the side surface 1a of the internal bath 1 and the side surface 2a of the external bath 2 which is on the positive-value side in the Y-direction. In a similar manner, a gutter part 30b is formed between the side surface 1b of the internal bath 1 which is on the negative-value side in the X-direction and the side surface 2b of the external bath 2 which is on the negative-value side in the X-direction, and a gutter part 30c is formed between the side surface 1c of the internal bath 1 and the side surface 2c of the external bath 2 which is on the negative-value side in the Y-direction. Further, the depth is deep and a reservoir part 30d is formed between the side surface 1d of the internal bath 1 which is on the positive-value side in the X-direction and the side surface 2d of the external bath 2 which is on the positive-value side in the X-direction.

Figure 3:
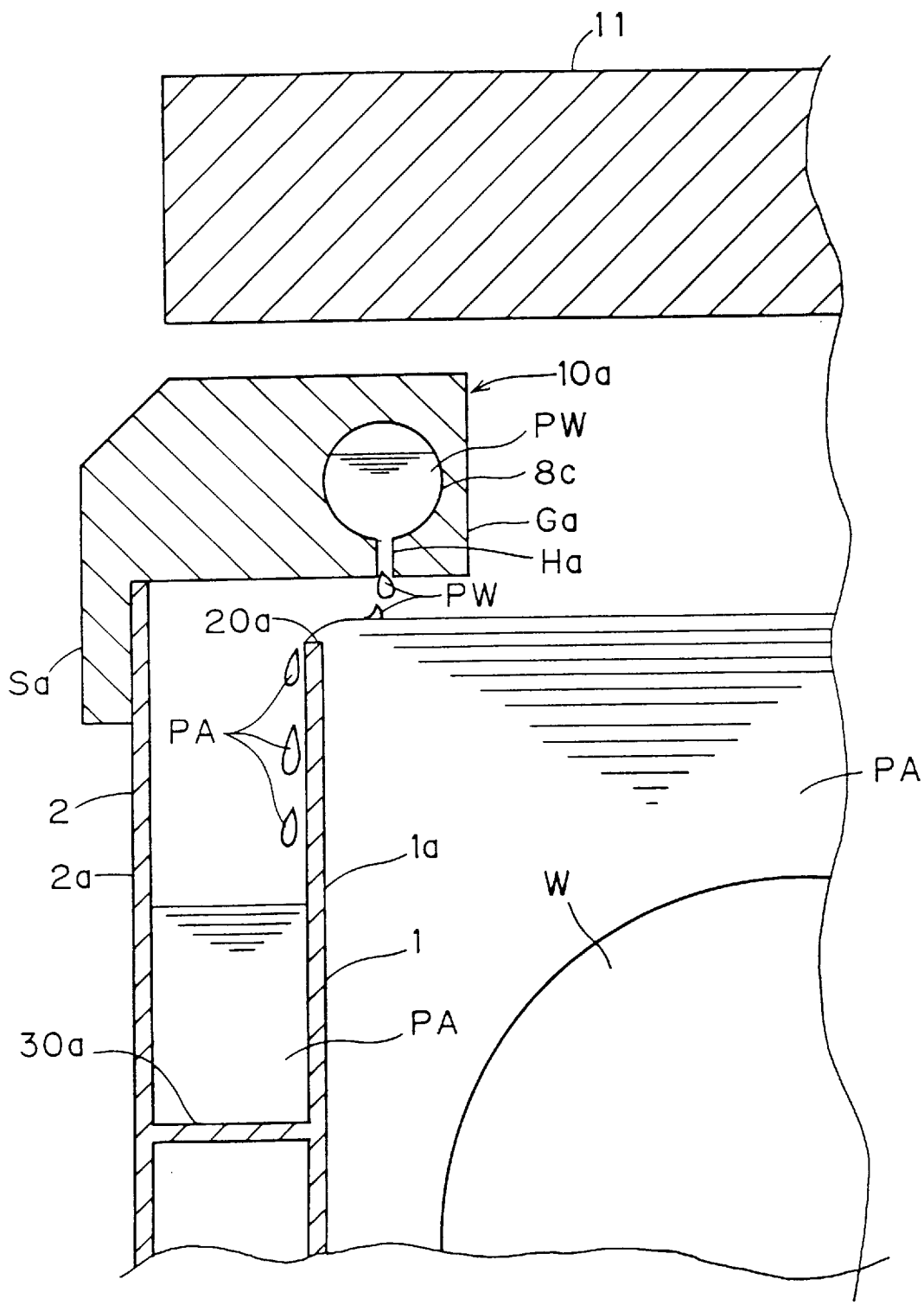
FIG. 3 is a partial cross sectional view of the substrate processing apparatus according to the preferred embodiment.

FIG. 3 is a partial cross sectional view of the substrate processing apparatus according to the preferred embodiment, around the de-ionized water supply nozzle 10a. In the de-ionized water supply nozzle 10a, a support part Sa is fixedly disposed to an external top portion of the side surface 2a of the external bath 2, a stretching part Ga stretches beyond the side surface 1a of the internal bath 1, and a lower surface of the stretching part Ga is located above and close to the overflow part 20a which is a top edge of the side surface 1a of the internal bath 1. The pipe 8c is inserted through the de-ionized water supply nozzle 10a. A plurality of deionized water blow-off openings Ha for supplying the phosphoric acid solution PA are formed in the pipe 8c, at equal intervals in an X-axis direction of FIG. 1, on a lower surface side of a blow-off position Ua of the pipe 8c above the internal bath 1.

In the de-ionized water supply nozzle 10b as well in a similar manner, a support part Sb (See FIG. 1) is fixedly disposed to an external top portion of the side surface 2c of the external bath 2, a lower surface of a stretching part Gb is located above and close to the overflow part 20b which is a top edge of the side surface 1c of the internal bath 1, and a plurality of de-ionized water blow-off openings Hb are formed in the pipe 8d which is disposed inside the de-ionized water supply nozzle 10b, at equal intervals in the positive X-axis direction, on a lower surface side of a blow-off position Ub of the pipe 8d above the internal bath 1.

2. Characteristic Of And Processing In Preferred Embodiment

Now, a description will be given on entire processing and a characteristic of the substrate processing apparatus according to the preferred embodiment.

During etching of the substrates W, the phosphoric acid solution PA flows over at the top edges of the four side walls of the internal bath 1.

Flowing over from the internal bath 1 into the external bath 2, the phosphoric acid solution PA is constantly drained out from the external bath 2 by the circulation pump 4 through the pipe 3a, supplied to the heater 5 through the pipe 3b, and heated by the heater 5 so that the temperature of the solution is kept at 150°–180° C. Passing the heater 5, the phosphoric acid solution PA is supplied to the filter 6 through the pipe 3c. After impurities and the like are filtered out by the filter 6, the phosphoric acid solution PA is returned to the internal bath 1 through the pipe 3d and used again for etching of the substrates W. In this manner, the substrate processing apparatus according to the preferred embodiment circulates and uses the phosphoric acid solution PA.

Further, since the temperature of the phosphoric acid solution PA is kept at 150°–180° C. as described above, moisture contained in the phosphoric acid solution PA easily evaporates and hence easily causes a change in the concentration of the phosphoric acid solution PA. To deal with this, with this apparatus, an operator measures a change in the concentration of the phosphoric acid solution PA which is caused by evaporation of the de-ionized water PW, using measuring instruments or the like. The operator calculates an evaporation quantity per unit time of the de-ionized water PW from measurements and sets the flow rate of the fixed displacement pump 9, so that an appropriate quantity of the de-ionized water PW is supplied to the de-ionized water injection nozzles 10a and 10b from the de-ionized water bath 7.

The de-ionized water PW supplied to the de-ionized water injection nozzles 10a and 10b is discharged through the plurality of de-ionized water blow-off openings Ha and Hb which are formed respectively in the de-ionized water injection nozzles 10a and 10b as shown in FIG. 3. The de-ionized water PW reaches the surface of the phosphoric acid solution PA above the internal bath 1, immediately below the de-ionized water blow-off openings Ha and Hb, and close to the overflow parts 20a and 20b which are respectively the top edges of the side surfaces 1a and 1c of the internal bath 1. The de-ionized water PW thereafter reaches the gutter parts 30a and 30c of the external bath 2, as it is mixed with the phosphoric acid solution PA, and flows into the reservoir part 30d of the external bath 2.

The phosphoric acid solution PA stored in the reservoir part 30d of the external bath 2 is returned to the internal bath 1 through the pipes 3a to 3d, the circulation pump 4, the heater 5 and the filter 6 as described above, and is used again for etching of the substrates W.

Thus, the substrate processing apparatus according to the preferred embodiment is structured so that the de-ionized water PW is supplied close to the overflow parts 20a and 20b for overflowing the phosphoric acid solution PA, which are respectively the top edges of the side surfaces 1a and 1c of the internal bath 1. The de-ionized water PW never reaches inside the phosphoric acid solution PA within the internal bath 1. This prevents sudden boiling of the de-ionized water PW but rather stirs up the phosphoric acid solution PA and the de-ionized water PW when the phosphoric acid solution PA flows over from the internal bath 1 into the external bath 2. Hence, the de-ionized water PW is sufficiently diffused into the phosphoric acid solution PA, which in turn does not keep the de-ionized water PW at the surface of the phosphoric acid solution PA. Since the de-ionized water PW does not evaporate directly into air from the surface of the phosphoric acid solution PA, a decrease in the temperature of the phosphoric acid solution PA is small.

3. Modification

While among the plurality types of liquid consisting the processing liquid, one having a higher boiling temperature than the temperature of processing liquid is a phosphoric acid solution and the supplementary liquid is de-ionized water in the substrate processing apparatus according to the preferred embodiment of the present invention, the plurality types of liquid consisting the processing liquid are not limited to this. Rather, a sulfuric acid solution and a hydrogen peroxide solution may be combined with each other to obtain the processing liquid, for example. In this case, the temperature of the processing liquid is heated to about 130° C. which is higher than the boiling temperature of the hydrogen peroxide solution, and therefore, the sulfuric solution is used as the liquid having a higher boiling temperature than the temperature of processing solution and de-ionized water is used as the supplementary liquid.

Further, although the substrate processing apparatus according to the preferred embodiment uses only de-ionized water as the supplementary liquid, the supplementary liquid may be a plurality types of liquid each having a boiling temperature which is equal to or lower than the processing liquid.

Further, although the substrate processing apparatus according to the preferred embodiment requires to form the plurality of de-ionized water blow-off openings at equal intervals in the pipes which are disposed inside the de-ionized water injection nozzles, the intervals may not be equal intervals and only one de-ionized water blow-off opening may be formed in each pipe. Still further, the means for supplying de-ionized water is not limited to this, but rather may be slit openings, for instance.

Further, while an operator measures a change in the concentration of the phosphoric acid solution using measuring instruments or the like, calculates the evaporation quantity per unit time of the de-ionized water from measurements and sets the supplementing quantity of de-ionized water which is pumped out by the fixed displacement pump in the substrate processing apparatus according to the preferred embodiment, the concentration of the phosphoric acid solution may be monitored in a time-sequence manner by a sensor or the like and a control apparatus may control a flow rate control type pump based on obtained data so as to adjust the supplementing quantity of the de-ionized water.

Further, although the substrate processing apparatus according to the preferred embodiment is structured to overflow the phosphoric acid solution into the external bath on the four sides across the side surfaces on the four sides of the internal bath 1 whose top edges are at the same height, the present invention is not limited to such a structure where the phosphoric acid solution flows over on the side surfaces on all of the four sides. For example, the overflow parts 20a and 20b, which are respectively the top edges of the side surfaces 1a and 1c of the internal bath 1, may be formed lower than the other two side surfaces 1b and 1d so that the phosphoric acid solution flows over across only the side surfaces 1a and 1c.

Further, while the substrate processing apparatus according to the preferred embodiment requires to use two de-ionized water injection nozzles, only one de-ionized water injection nozzle may be disposed above only one side wall of the internal bath or four de-ionized water injection nozzles may be disposed respectively above the four side walls of the internal bath.

Further, although the de-ionized water blow-off openings Ha and Hb of the de-ionized water injection nozzles 10a and 10b are formed above and close to the overflow parts 20a and 20b in the substrate processing apparatus according to the preferred embodiment, the de-ionized water blow-off openings Ha and Hb may disposed immediately above the overflow parts 20a and 20b.

In the substrate processing apparatus according to the preferred embodiment, the de-ionized water injection nozzles 10 are made of Teflon (Trademark used on the Du Point's tetrafluoroethylene polymer), the internal bath 1 and the external bath 2 are made of quartz, and the other members are made of heat-resistant and corrosion-resistance materials such as Teflon and PTPF (polytetrafluoroethylene), to deal with heat and corrosion caused by the phosphoric acid solution.

Further, in the substrate processing apparatus according to the preferred embodiment, the capacity of the processing bath as a whole including the internal bath and the external bath is 30–40 liters and the flow rate of the fixed displacement pump is adjustably set between 0 cc/min to 200 cc/min. Thus, in the preferred embodiment, it is possible to adjust the quantity of de-ionized water to supply, depending on the quantity of evaporated moisture relative to the quantity of the phosphoric acid solution.

While the invention has been described in detail, the foregoing description is in all aspects illustrative and not restrictive. It is understood that numerous other modifications and variations can be devised without departing from the scope of the invention.

We claim:

1. An apparatus for processing a substrate in a processing liquid, comprising:

a) an internal bath in which a processing liquid is filled such that a substrate is dipped into said processing liquid,
wherein said processing liquid essentially consists of a plurality of liquid components,
a temperature of said processing liquid is maintained higher than a boiling temperature of at least one of said plurality of liquid components, and
said processing liquid overflows an edge of said internal bath;

b) supply means for supplying a supplementary liquid to said overflow of said processing liquid at a top of or around said edge of said internal bath, said supplementary liquid having a boiling temperature same as or lower than said temperature of said processing liquid;

c) an external bath being outside of said internal bath to receive said overflow of said processing liquid; and d) feedback means for feeding said overflow back to said internal bath whereby said processing liquid circulates between said internal bath and said external bath while supplied with said supplementary liquid.

2. The apparatus of claim 1, wherein said supply means includes:

b-1) nozzle means for supplying said supplementary liquid to said overflow of said processing liquid along said edge.

3. The apparatus of claim 1, wherein said processing liquid is a solution of phosphoric acid, and said supplementary liquid is de-ionized water.

4. The method of claim 3, wherein said feedback means includes:

d-1) means for heating said overflow to maintain said temperature of said processing liquid in a temperature range from 150° C. to 180 ° C.

5. The method of claim 4, wherein said feedback means further includes:

d-2) filter means for filtering said overflow.

* * * * *